(12) United States Patent
Snell

(10) Patent No.: US 10,349,579 B2
(45) Date of Patent: Jul. 16, 2019

(54) FLEX BAR SYSTEM FOR MASS VIBRATION SYSTEMS IN CHANGING SPATIAL ORIENTATION USING MAGNETOSTRICTIVE ACTUATOR

(71) Applicant: Westside Equipment Co., Crows Landing, CA (US)

(72) Inventor: Lloyd Snell, Ames, IA (US)

(73) Assignee: Westside Equipment Co., Crows Landing, CA (US)

(*) Notice: Subject to any disclaimer, the term of this patent is extended or adjusted under 35 U.S.C. 154(b) by 30 days.

(21) Appl. No.: 15/647,178

(22) Filed: Jul. 11, 2017

(65) Prior Publication Data

US 2018/0020618 A1    Jan. 25, 2018

Related U.S. Application Data

(60) Provisional application No. 62/365,918, filed on Jul. 22, 2016.

(51) Int. Cl.
  *A01D 46/26* (2006.01)
  *H01L 41/12* (2006.01)

(52) U.S. Cl.
  CPC .............. *A01D 46/26* (2013.01); *H01L 41/12* (2013.01)

(58) Field of Classification Search
  CPC .............. A01D 46/26; A01D 2046/262; A01D 2046/266; B06B 1/183; B66C 1/445; H02N 2/186; H02N 2/188
  See application file for complete search history.

(56) References Cited

U.S. PATENT DOCUMENTS

| | | | |
|---|---|---|---|
| 3,392,517 A * | 7/1968 | Nye ..................... | A01D 46/26 56/340.1 |
| 5,231,887 A | 8/1993 | Arvidsson et al. | |
| 5,406,153 A | 4/1995 | Flatau et al. | |
| 5,413,453 A * | 5/1995 | Hill ...................... | A01D 46/26 414/729 |
| 5,510,660 A | 4/1996 | Flatau et al. | |
| 5,595,054 A * | 1/1997 | Reynolds de Sousa ..................... | A01D 46/26 56/340.1 |
| 5,765,349 A * | 6/1998 | Michelson ............. | A01D 46/26 56/328.1 |
| 5,880,542 A | 3/1999 | Leary et al. | |
| 6,186,228 B1 | 2/2001 | Wegener et al. | |
| 7,255,290 B2 | 8/2007 | Bright et al. | |
| 7,757,471 B2 * | 7/2010 | Mayo ..................... | A01D 46/26 56/340.1 |

(Continued)

FOREIGN PATENT DOCUMENTS

| | | | | |
|---|---|---|---|---|
| CN | 103071614 A | * | 5/2013 | ............... B06B 1/08 |
| CN | 202909927 U | * | 5/2013 | ............... B06B 1/08 |

(Continued)

*Primary Examiner* — Arpad Fabian-Kovacs
(74) *Attorney, Agent, or Firm* — Mark D. Miller; William K. Nelson

(57) ABSTRACT

The present invention provides methods and apparatus for inducing (harmonic) vibration of objects having a large mass(es), such as the trunk of a fruit or nut tree, the crop of which may be harvested by shaking the tree through the induced vibration. Linear and radial embodiments utilize and include an actuator using Terfenol-D, a magnetostrictive actuator. Different versions utilize a piston rod actuator.

34 Claims, 12 Drawing Sheets

(56) References Cited

U.S. PATENT DOCUMENTS

| | | | |
|---|---|---|---|
| 8,113,179 B1 | 2/2012 | Bright | |
| 8,650,847 B2 | 2/2014 | Snell | |
| 2004/0163375 A1* | 8/2004 | Suter | A01D 46/26 56/328.1 |
| 2004/0221565 A1* | 11/2004 | Suter | A01D 46/26 56/340.1 |
| 2005/0146231 A1* | 7/2005 | Or | B06B 1/08 310/26 |
| 2005/0166568 A1* | 8/2005 | Zehavi | A01D 46/26 56/329 |
| 2008/0016838 A1* | 1/2008 | Pellenc | A01D 46/26 56/340.1 |
| 2012/0326536 A1* | 12/2012 | Nair | H01L 41/125 310/26 |

FOREIGN PATENT DOCUMENTS

| | | | | |
|---|---|---|---|---|
| CN | 107127134 A | * | 9/2017 | B06B 1/08 |
| CN | 107931079 A | * | 4/2018 | B06B 1/08 |
| FR | 2639176 A | * | 5/1990 | A01D 46/26 |
| JP | 09009396 A | * | 1/1997 | H04R 1/44 |
| NL | 6904088 A | * | 9/1970 | A01D 46/26 |

\* cited by examiner

FLEX BAR SYSTEM FOR MASS VIBRATION SYSTEMS IN CHANGING SPATIAL ORIENTATION USING MAGNETOSTRICTIVE ACTUATOR

PRIORITY CLAIM

This application is a non-provisional of and claims the benefit of U.S. Provisional Application No. 62/365,918 filed on Jul. 22, 2016, which is incorporated herein by this reference in its entirety.

BACKGROUND OF THE INVENTION

The present invention relates to methods and apparatus for inducing (harmonic) vibration of objects having a large mass(es), such as the trunk of a fruit or nut tree, the crop of which may be harvested by shaking the tree through the induced vibration.

FIELD OF THE INVENTION

In tree shaking, the shaker head orientation to the tree trunk requires tilting, rolling, and yawing to align the clamping arms normal, perpendicular, and parallel to the tree trunk. The shaker head is then clamped to the tree trunk and the vibration energy is transferred from the shaker to the tree in order to dislodge nuts and fruit. This variable spatial orientation requirement minimizes the risk of damaging the tree's bark during the shaking sequence. Nevertheless, many existing shaker harvesting systems use mechanical forces that can cause damage to trees. In response, a system for harvesting nut and fruit trees that includes an electromechanical shaker head, a transport mechanism, and a control system was developed, as disclosed in U.S. Pat. No. 8,650,847 (Snell). However, the introduction of nut and fruit harvesting tree shakers using a magnetostrictive actuator (such as Terfenol-D, TbxDy1-xFe2 (x~0.3)) at high frequency with large reaction mass(es) on a mobile platform requires significant advances in the mechanical preloading and suspending systems of the mass(es) relative to a magnetostrictive actuator.

Terfenol-D is in a class of electrostrictive, ferroelectric, and piezomagnetic materials commonly referred to as magnetostrictive materials. Terfenol-D is a giant magnetostrictive material (GMM) which transforms magnetic field waveforms in the physical strain. For the purpose of this disclosure, a preferred actuator for use in tree shaker harvesting systems is a Terfenol-D magnetostrictive actuator, hereafter sometimes referred to as a magnetostrictive actuator bar or rod.

Terfenol-D is a preferred actuator solution for use in tree shakers due to its published material strain capabilities (1200-2000 ppm) and high force output. Prior uses of these actuators cover such things as vibration and force generators and position and valve control of diesel injectors. In addition to extreme positioning requirements, a significant advantage of a Terfenol-D magnetostrictive actuator is that the actuator and its components are expected to withstand 11.5 million cycle/year ($1.15 \times 10^7$ cycle/year), based on a 2-second shake at 80 Hz, 120 trees/acre, and 600 acres/yr for and an infinite number of years. In essence, such a shaker head and components should have infinite life. In addition, when a Terfenol-D actuator rod is mounted and according to embodiments of the present invention, the force output may be effectively doubled, to as much as 4000 ppm or more.

However, Terfenol-D magnetostrictive actuators, beyond the fundamental elemental properties of any crystalline rod, require a mechanical system that (1) provides preload, (2) maintains linear motion, and (3) prevents the Terfenol-D rod from experiencing a non-compressive loading. In particular, Terfenol-D material is brittle when not in compressive loading. Transmitted torque, coupled moments, impact, and/or tension can result in actuator rod failure. If Terfenol-D is not maintained in a compressive state, the rod will fracture. Therefore, in addition to the preloading, the system must prevent the unloading due to mass inertia after acceleration by the Terfenol-D rod expansion.

It is also preferred, but not required, that the system supporting the Terfenol-D rod (1) prevents the transmission of a coupled moment transmitted to the crystalline rod, (2) is assembled and operates without the introduction of torque to the crystalline rod, (3) has minimization of components and mechanical losses, while maximizing dynamic displacement performance.

Belleville Springs are not Viable Solutions for Preload

Because Terfenol-D actuator rods require preload, one option for accomplishing this is the use of disc springs commonly known in the art as Belleville springs. Belleville springs are high force and small displacement conservation of energy mechanisms used singularly or in stacked combinations. Unfortunately, Belleville springs have Friction and Damping losses, which make them undesirable for use with Terfenol-D actuator rods. When Belleville springs are utilized in stacks, friction levels (mechanical loss) are higher than equivalent coil springs. Systems utilizing Belleville springs experience all of the following disadvantages:

- Friction in the Guides (mechanical loss) results from the sliding movement of the individual disc springs during the working stroke.
- Internal Friction due to elastic deformation which occurs in all elastically deformed steel parts. This occurs in all spring parts.
- Friction on the End Abutments (mechanical loss) occurs on the end disc springs of a stack have a small radial movement on the abutment faces which causes friction (also wear). This friction also occurs when only one-disc spring is used.
- Friction through Parallel Stacking is generated in proportion to the number of discs in parallel. Stacks with parallel sets should be fitted where damping is required. Since friction is transferred to heat, the heat generated by springs in parallel sets can be considerable depending on the frequency. Good lubrication is essential to prevent fretting corrosion.

Belleville springs also experience preloading losses, as well as increased frictional losses from other linear translational elements with sliding contacts.

To prevent the individual Belleville discs from moving laterally during deflection, it is important that the loading cross section be generally rectangular. However, to prevent lateral movement and a coupled moment transmission to a magnetostrictive actuator such as Terfenol-D, additional components would be needed.

Finally, Belleville springs do not have precise axial orientation capabilities. Belleville springs require clearance in the installation cavity to allow for diametrical change due to compression of the spring. Misalignment of axis increases the magnitude of the buckling force, potential for torsional force transmission, or the introduction of a moment on the actuator rod. To prevent this, an output piston or pin is connected to the rod and slides within a controlling bore. The results of such a designs are more friction, heat, hysteresis, and ultimately wear and failure of the actuator.

It is also worth noting that Belleville springs are represented as having "practically" unlimited life capable of exceeding $2 \times 10^6$ cycles without failure. However, Belleville's own language hedges the concept of unlimited life by using the word "practically"—which is not infinite life, and represents a full magnitude less than a single harvest season requirement. Combined with the friction and ultimate wear of the spring contact surfaces, the utilization of Belleville spring of are not a viable solution in for holding a compressive preload on a Terfenol-D magnetostrictive actuator in spatial orientations or minimizing losses due to hysteresis.

Other Springs are not Viable Solutions for Preload

U.S. Pat. No. 5,880,542 (Leary et al., 1999) describes a high force, low mass design for a reaction mass actuator (RMA) where a cylindrical actuator assembly is suspended through the use of O-rings contacting a cylindrical housing. The pre-load elements in this design use a wave washer, Belleville washer, and shims to load a Terfenol-D rod against a mounting lug. The frictional losses with the wave washer and suspension of the actuator through the use of elastomeric members will be similar to the losses described above. In addition, O-rings are subject to plastic deformation, fretting, and hardening over time. If the assembly of the present invention were horizontally orientated (as in the Leary patent), where gravity acts on the heavy mass, and depending on the location of the center of gravity, the result would be either a localized compressive loading on the O-rings, a coupled moment, or both. Either of these events could cause premature failure of the magnetostrictive actuator (Terfenol-D). Moreover, the limited life associated with wearing O-rings suspending the actuator along with the frictional losses make this option not viable.

U.S. Pat. No. 5,231,887 (Arvidsson et al., 1993) discloses a force actuator that utilizes a threaded assembly consisting of a drive member which is push rod (FIGS. 2, 18, 21, and 22). Using this assembly in a high frequency, high mass system will fail at the threaded connection. In addition to threaded assemblies, the use of linear guides (FIG. 2, 15; FIG. 4, 44) and Belleville washers also fail to provide a solution that meets the robust, high mass in a spatial orientation requirements associated with tree crop shaker harvesting.

U.S. Pat. No. 5,406,153 (Flatau et al., 1995) discloses a vibration generation system utilizing a threaded washer, adjusters (FIGS. 7, 8, and 9) and Belleville springs to provide the preload requirements for magnetostrictive actuators. The patent notes that the design utilizing threaded fits are "sloppy" and result in excessive play and resulted in tipping, uneven loading, binding, and unwanted damping (See, e.g., Column 6, Lines 41-54). These will prevent maximizing the output from a Terfenol-D actuator rod.

U.S. Pat. No. 7,255,290 (Bright et al., 2007) discloses a magnetostrictive actuator for Very High-Speed Rate Shaping Fuel Injector. In this initial design, the actuator has caps on each end that provide compressive preloading function and axial alignment. The top end of the injector is comprised of four elements: a screw (FIG. 3, 7), a nut (FIG. 3, 14), a washer (FIG. 3, 15), and a cap (FIG. 3, 13). In this configuration, the washer is concentric to the body bore, and the cap locks the washer in place. The screw then applies the force to the endcap and the nut locks the screw. This method of preloading is very common in magnetostrictive actuator solutions. The opposing endcap engages a spring plate (FIG. 3, 11) and valve (FIG. 3, 6). The valve interface with the endcap provides the axial alignment. However, despite the use of endcaps, confinement to the axis of elongation requires multiple additional components which are not needed in embodiments of the present invention.

U.S. Pat. No. 8,113,179 (Bright, 2012) makes the following disclosure concerning the utilization of springs to apply a compressive preload in the prior art (including the '290 patent):

"The prior art's utilization of springs to apply a compressive preload present several disadvantages, and many of such improvements can be accomplished by the removal of mechanical springs that apply a compressive preload. Springs that can apply the required compressive preload at the required stiffness and survive the fatigue requirements have either relatively large diameters as in the case of disc springs [Belleville springs] or long length as in the case of coil springs. Conserving diameter is preferred for any device on an engine cylinder head but this is in direct conflict with the transducer advantage of locating the spring closer to the tip of the injector that protrudes into the combustion chamber. Even though a spring that increases diameter would have the advantage of being shorter with less mass to accelerate, it may be very difficult to fit it onto a particular engine. Friction and fretting wear on the edges of this type of spring would limit injector life.

The second kind of spring adds length and bulk which also add much more mass to be accelerated, limiting performance. Besides mass, moving elements that are relatively long and thin will show a tendency to bend and vibrate and therefore would need a guided, adding fabrication cost. The spring itself will interact with the deflections and speed required . . . " (Col. 4, lines 42-64.)

Summarizing all spring designs, the Bright, 2012 patent concludes that the need to compress the springs during assembly must be achieved without the application of twist (torque) or misalignment of the endpieces with axial forces. To do so would be damaging to the brittle magnetostrictive alloy.

The Bright, 2012 patent provides the following solution: utilize exiting fluids (diesel fuel) to pressurize a chamber and preload the magnetostrictive actuator (See Col. 7, Lines: 15-41). Although this may be a viable solution for diesel injectors, the intricacies of the component fits are not economically feasible for a large mass vibration system.

One other patent is known which discloses a magnetostrictive actuator application, U.S. Pat. No. 5,510,660 (Flatau, et al., 1996).

Solution Objectives

It is therefore an objective of the present invention to provide systems and methods for inducing large mass vibration using a magnetostrictive actuator rod that effectively doubles the output over existing systems.

It is also an objective of the present invention to provide a preload system for use with a magnetostrictive actuator rod for inducing large mass vibration without the use of traditional springs.

It is also an objective of the present invention to provide spring systems for use with magnetostrictive actuator rods that eliminate the known losses associated with Belleville springs.

It is an objective of the present invention to provide spring systems for use with magnetostrictive actuator rods that eliminate the known losses associated with coil springs.

It is an objective of the present invention to provide preloading methods for magnetostrictive actuator rods without the use of Belleville spring washers, coil springs, or high-pressure fluid.

It is an objective of the present invention to provide stable platforms for constraining high masses vibrating in spatially orientated positions to provide appropriate performance for the harvest of nut and fruit trees.

It is an objective of the present invention to provide stable platforms for constraining high masses vibrating in spatially orientated positions to provide appropriate performance for multiple applications other than harvesting trees.

It is an objective of the present invention to utilize the high efficiency of embodiments of the present invention in other high performance, large and small mass vibrators, operating in extreme conditions.

It is an objective of the present invention to provide embodiments that support preloading of a magnetostrictive actuator without the use of threaded assembly components.

It is an objective of the present invention to provide embodiments that eliminate the transmission of torque to a magnetostrictive actuator during assembly or operation.

It is an objective of the present invention to provide embodiments that eliminate the transmission of a coupled moment to a magnetostrictive actuator during assembly or operation.

It is an objective of the present invention to provide embodiments with axially aligned actuator loading during assembly and operation.

It is an objective of the present invention to provide embodiments that during setup spring constants and actuator actual mechanical properties can be calculated into the appropriate shimming requirements.

It is an objective of the present invention to provide embodiments having preload adjustability by using shims.

It is an objective of the present invention to provide embodiments that allow a magnetostrictive actuator act directly on a mass without the need for additional parts.

It is an objective of the present invention to provide embodiments where linear force constants prevent inertia over travel of the mass from unloading the magnetostrictive actuator.

It is an objective of the present invention to provide embodiments where non-linear force constants prevent inertia over travel of the mass from unloading the magnetostrictive actuator.

It is an objective of the present invention to provide embodiments that eliminate sliding loss between mounted components such as those encountered using Belleville springs.

It is an objective of the present invention to provide embodiments where mechanical losses are constrained to only internal friction, i.e., the inherent and internal properties of the stress and stainable materials, such as magnetostrictive and spring steels.

It is an objective of the present invention to provide embodiments where there exist no threaded connections between actuator and displacement/output components.

It is an objective of the present invention to provide embodiments where the motion of the mass is collinear with the axis of the magnetostrictive actuator.

It is an objective of the present invention to provide embodiments where the mass motion is collinear with the axis of the magnetostrictive actuator in any spatial orientation.

It is an objective of the present invention to provide embodiments where the assembly, actuator, and components are unaffected by high dirt, fluids, corrosive fluids, and/or high depth underwater service conditions.

It is an objective of the present invention to provide embodiments that are applicable to magneto- and electrostrictive actuators.

It is an objective of the present invention to provide embodiments that are applicable to hydraulic actuators.

It is an objective of the present invention to provide different sized units for different applications.

SUMMARY OF THE INVENTION

The embodiments of the present invention provide methods and apparatus for inducing (harmonic) vibration of objects having a large mass(es), such as the trunk of a fruit or nut tree, the crop of which may be harvested by shaking the tree through the induced vibration by utilizing and including an actuator using Terfenol-D, a magnetostrictive actuator. It is to be appreciated that embodiments of the present invention are not limited to shaker harvesters, and may be adapted for use in any situation where it is desirable to induce vibration into a large mass. The embodiments of the present invention provide predictable, accurate and reliable shaking motion which may be used, for example, to maximize tree crop harvesting with minimal damage to the trees themselves. The tree harvesting embodiments of the present invention are designed to provide many years of reliable service.

DETAILED DESCRIPTION

In addition to the magnetostrictive actuator, the following structural components are included in the preferred solutions design, although different combinations of these components may be utilized in other designs within the scope of the invention:

1. Endcaps with a convex spherically ground hardened end that engages mating surfaces on the flex bars, and a flat end normal to the centerline that is bonded to the magnetostrictive actuator.

2. Flex bars mounted in a planar or radial combination between two rigid structures.

3. A plurality of rigid mass structures connected by the flex bars; or a spline structure/weldment and mass structure connected by the flex bars.

4. Shim-able preload method.

Figure 1:
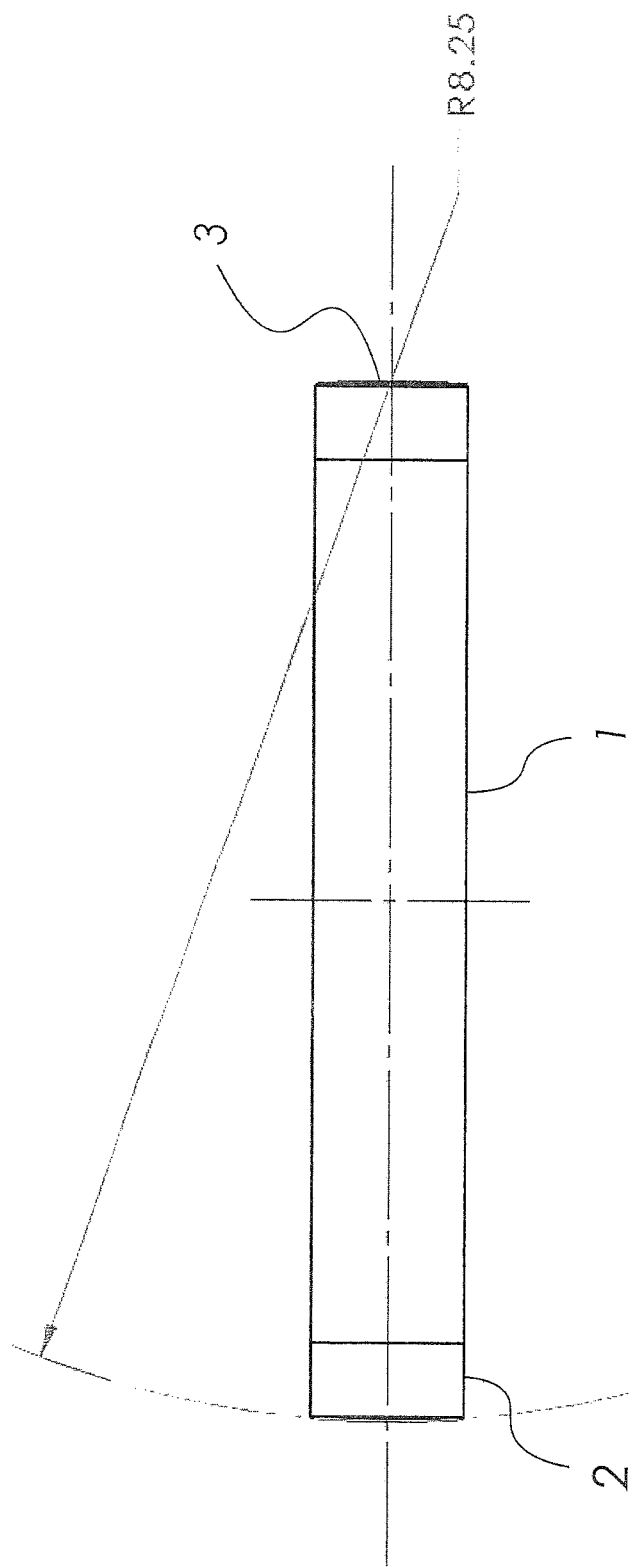
FIG. 1 illustrates an embodiment of a Terfenol-D rod assembly with hardened endcaps.

An exemplary magnetostrictive actuator assembly 1 is shown in FIG. 1, and is comprised of a Terfenol-D rod and two hardened endcaps 2. In this embodiment, each endcap has a planar surface which is normal to the Terfenol-D rod. This surface is bonded to the Terfenol-D rod and ground to diameter using standard manufacturing methods. The opposite (outer) surface of the endcap has a spherical (e.g. convex) surface 3 ground normal to the Terfenol-D rod centerline axis. The spherical surface has a radius that is equal to the length of the rod final assembly. By way of example and without limiting the potential sizes of these components, an exemplary length for the Terfenol-D rod and the two hardened endcaps is approximately 8.25 inch. Thus, the exemplary spherical surface radius would be approximately 8.25 inch.

In the embodiment of FIG. 1, the spherical surfaces of the endcaps are the contacts between the actuator and a primary flex bar at one end, and a compression plug 14 at the opposite end, each having a corresponding spherical (e.g. concave) mating surface. The spherical contact provides axial alignment, component containment without the use of additional components to insure linear translation. There are no mechanical losses due to friction. The spherical contact surface prevents the transmission of coupled moments and torque to the brittle magnetostrictive rod. It is to be appreciated that the spherical mating surfaces of either or both of the end caps 2 may be reversed, such that the end caps may have a concave spherical surface and the corresponding mating surface on the flex bar or compression plug may have a convex spherical surface; or one end cap may have a convex shperical surface, and the other end cap may have a concave spherical surface, with each endcap mating with a corresponding opposite spherical surface.

Figure 2:
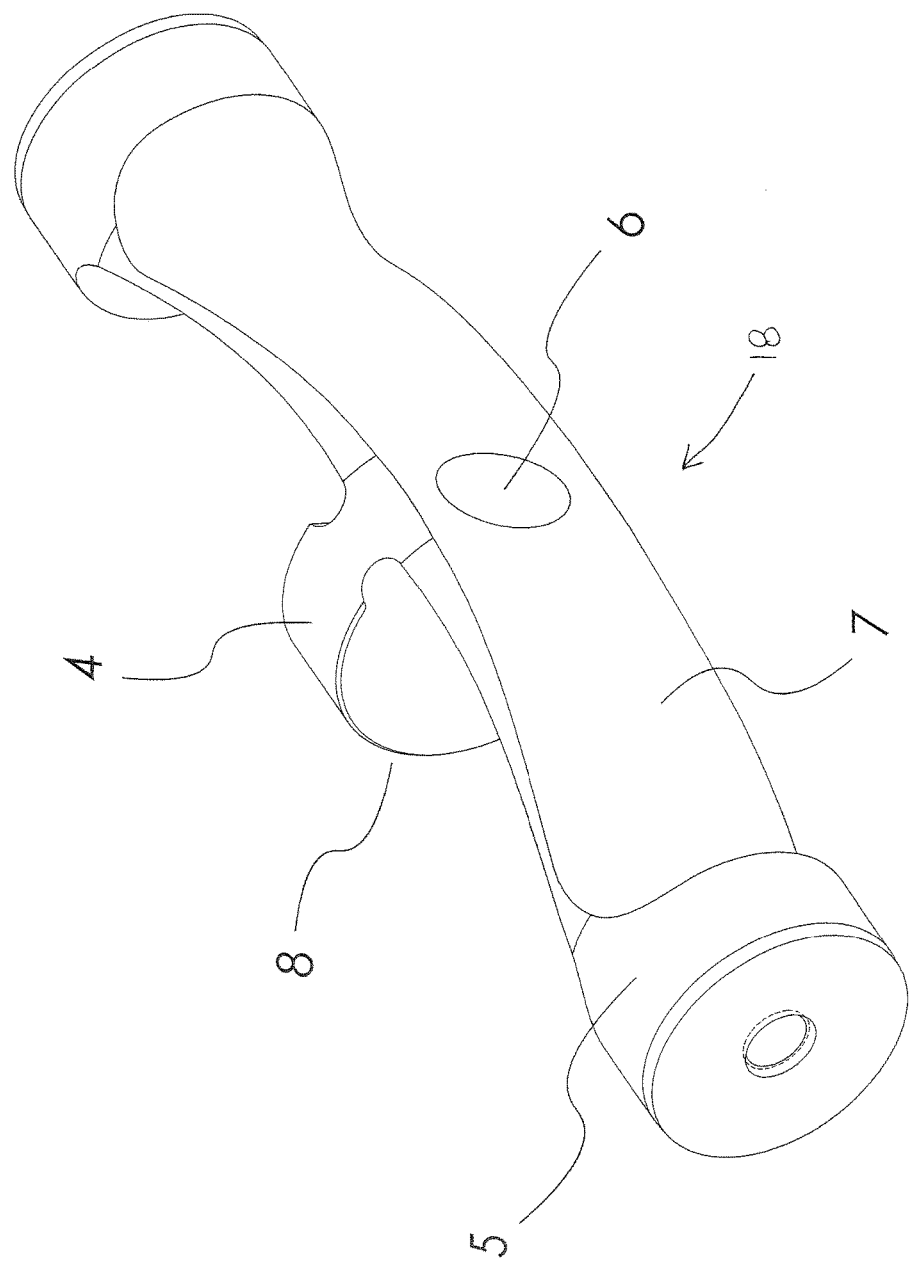
FIG. 2 illustrates an embodiment showing Mid, Flex, and Section Modulus planes for a flex bar. In this embodiment, the actuator axis is shown at the intersection of the Mid and Section Modulus plane.

Fundamental to the invention are the plurality of flexible ("flex") bars 18 and 18' (FIG. 2). Flex bars preferably have five design elements important for extended life: (1) axially aligning and (2) constraining the magnetostrictive actuator (Terfenol-D), (3) maintaining at least one degree of freedom (axial expansion due to actuator excitation) in spatial orientation, (4) providing required preloading, and (5) being scalable. A further description of the exemplary flex bars of the embodiment of FIG. 2 follows (in this example the flex bar is rounded, but it may also be provided in other suitable shapes):

1. Center cylindrical mount 4 for attaching to the spline structure 12 in a planar mount, or second flex bar in a radial mount orientation. By example, the center cylindrical mount may be cylindrical. Other geometries could be utilized to secure the flex bar to a mass structure, and the flex bar could be from a rectangular or square material. Utilized in certain product solutions, this could be a lower cost solution and still utilize all of the principles disclosed in the cylindrical solution.

2. End cylindrical mounts these end mounts 5 mount rigidly to the reaction mass 11. The orientation of flex bars can be planar or radial. By example, the flex bar center cylindrical mount 4 and end cylindrical mounts 5 may be coaxial. Other geometries could be utilized to secure the flex bar to a mass structure. Furthermore, the end cylindrical mounts could be offset from the centerline to provide additional options for the spring constant of the flexible sections. Furthermore, the flex bar could be from a rectangular or square material. Alternative geometries when utilized in alternative applications could provide lower cost solution and still utilize all of the principles disclosed in the cylindrical solution.

3. Spherical contact 6 is the contact point or surface between the primary flex bar 18 and the magnetostrictive actuator 1. The spherical contact provides axial orientation without the use of a cylindrical linear guide, for instance, an engine exhaust valve. The introduction of a sliding surface, such as a cylindrical linear guide, will not meet the high cycle requirements of the actuator due to wear and system failure. The magnetostrictive actuator should directly contact and act on the primary flex bar normal to the flexure plane and coincident with an axis defined by the mid plane and diameter plane. Doing so ensures the most efficient mechanical transfer. It is to be appreciated that the spherical contact point or surface may be either concave or convex, so long as it is complementary to the convex or concave shape of the corresponding end cap on the magnetostrictive actuator.

Figure 5:
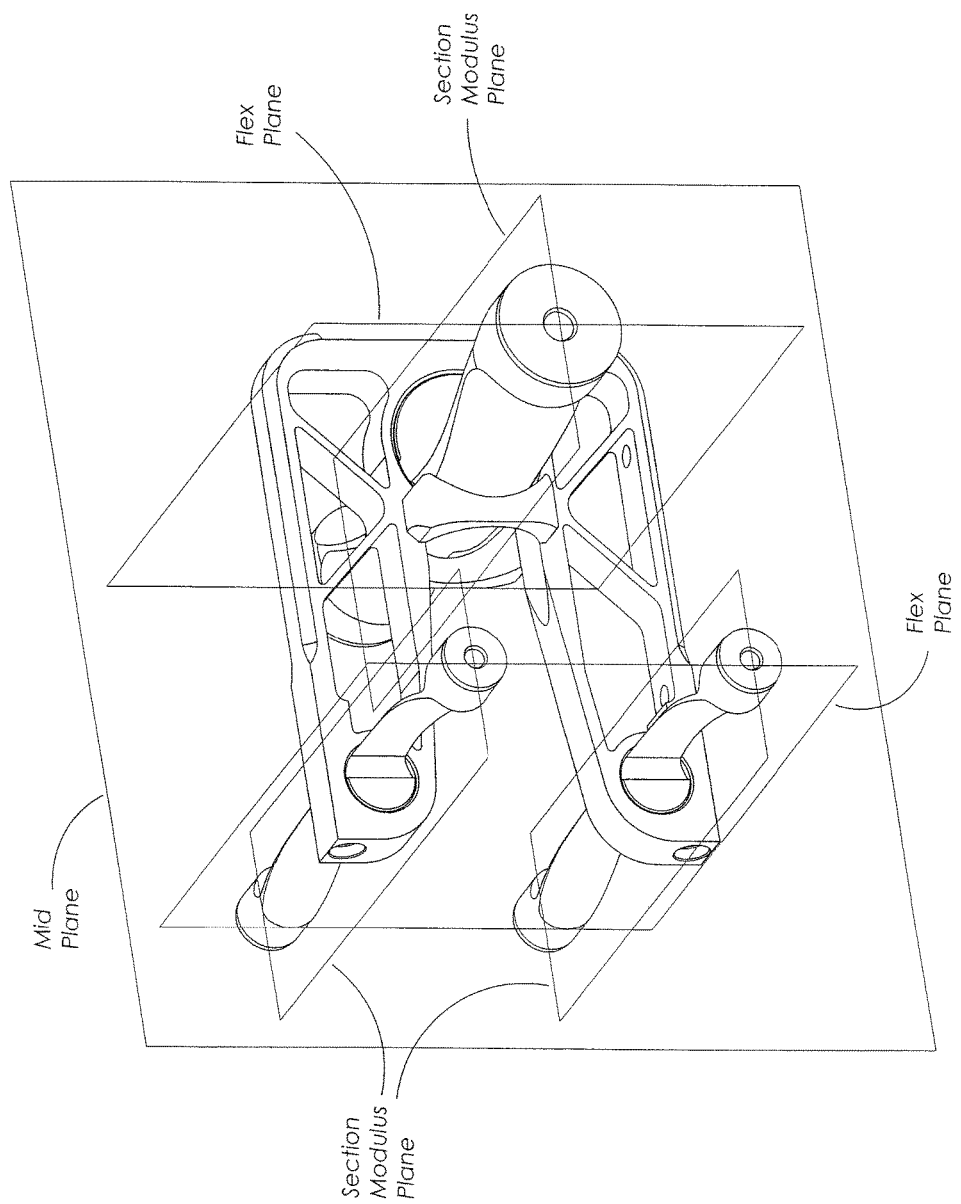
FIG. 5 illustrates an embodiment showing a planar orientation of flex bars which requires mounting to a common structure such that all flex bars connect to the center cylinder, and the Flex Planes and Section Modulus planes are parallel.

4. Flexible sections 7 are designed to a desired spring constant (k). The strain, i.e. stress, due to flexure is constrained entirely to in the flex plane section during operation, since the center and end cylindrical mounts are rigidly secured. The large 'Section Modulus' about the neutral axis, represented by the Section Modulus Plane (FIG. 5), and Mid Plane Section constrain the mass, preventing mass deflection ("sagging") during shaker orientation, and displacement is collinear with the axis of the magnetostrictive actuator.

Figure 3:
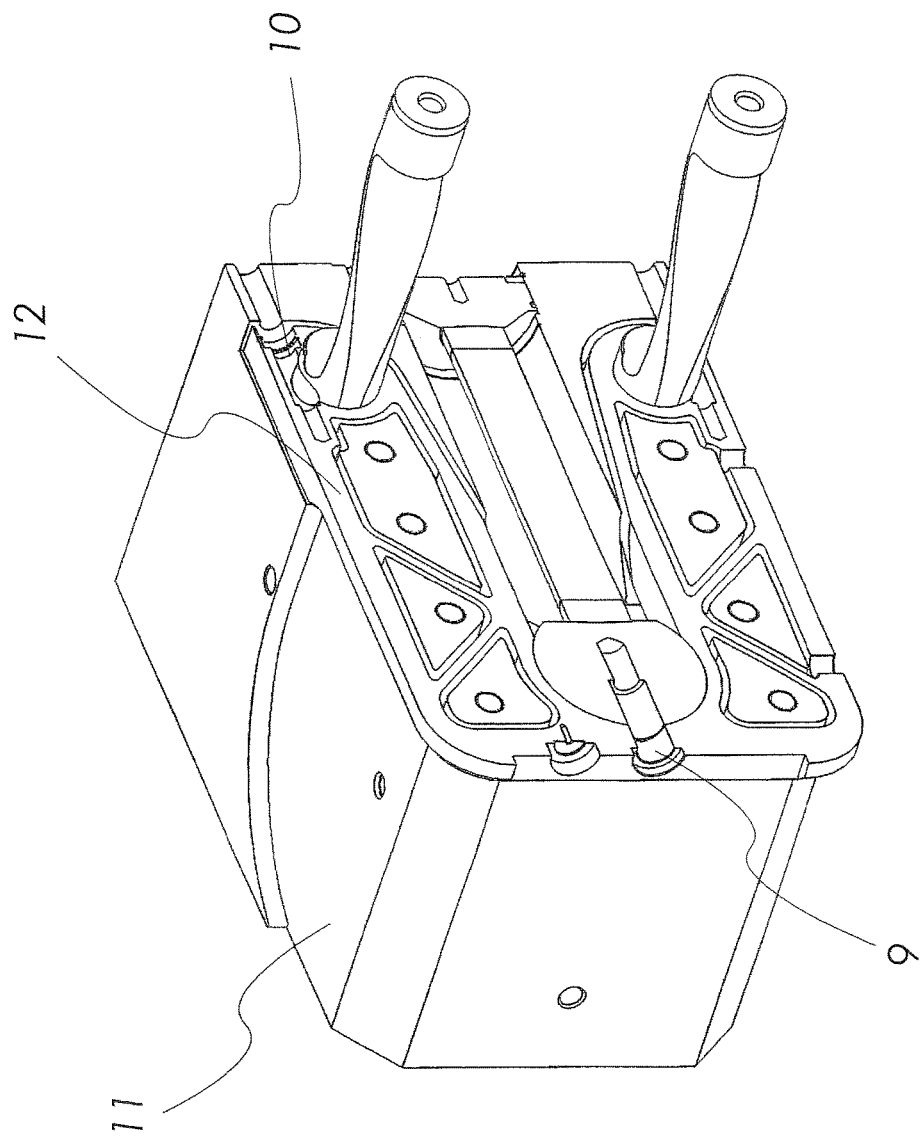
FIG. 3 illustrates an example of flex bar orientation features. In this embodiment, on the primary bar the orientation is a shoulder bolt 9 located on the magnetostrictive actuator centerline; orientation of the two secondary flex bars is achieved by a shoulder bolt 10 engaging with a radius on the flex bar.
Figure 4:
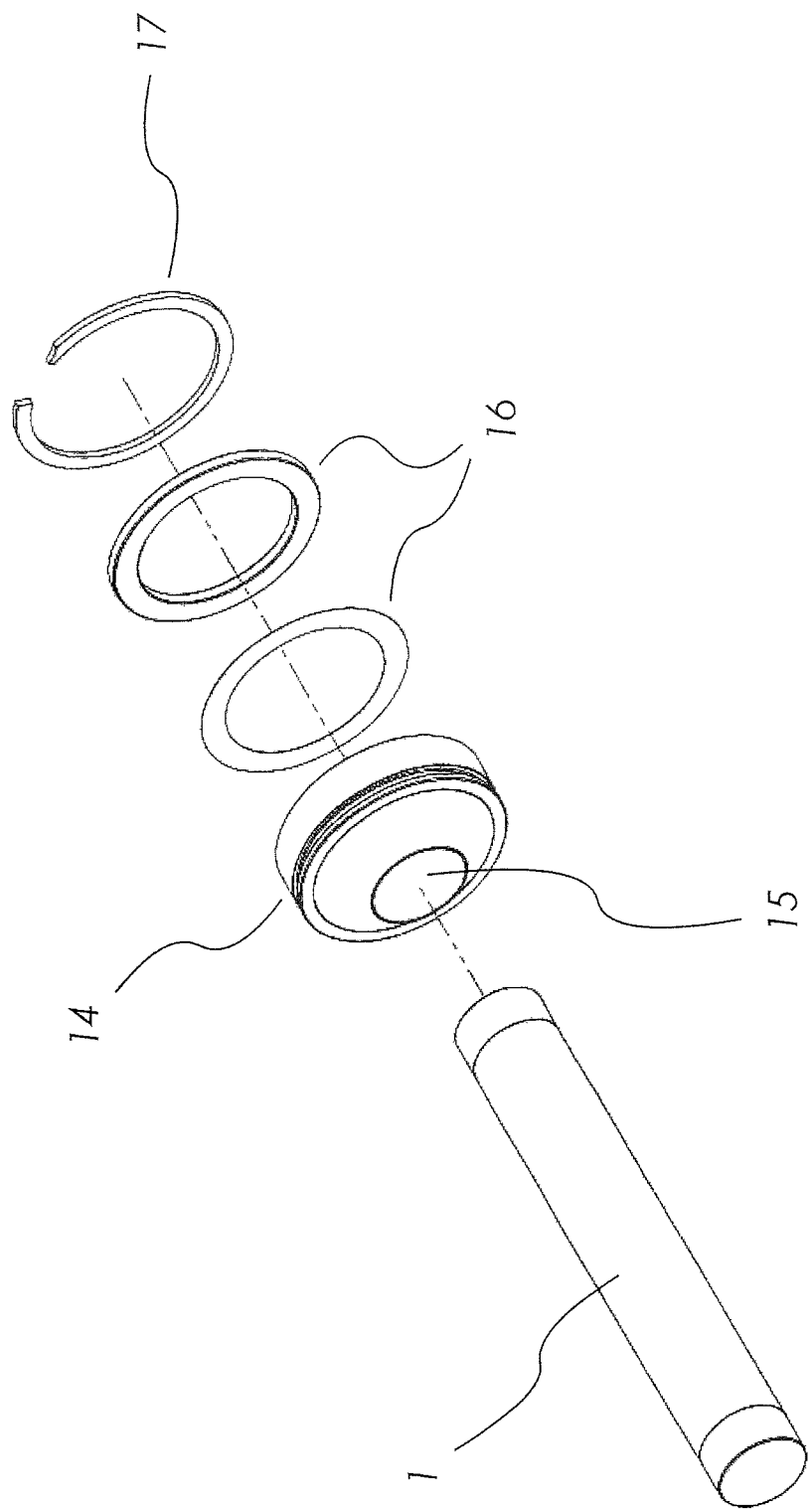
FIG. 4 shows exemplary assembly components required for assembly of a planar flex bar system. In this illustrated embodiment, the magnetostrictive actuator 1 is constrained between two spherical surfaces, one located on the flex bar (not shown) and the other located on the compression plug 14. Preload on the actuator rod is achieved by the use of a shim pack 16 and retained by a snap ring 17.

5. Timing feature 8 machined into the center cylindrical mount provides angular orientation to the spline structure 12 by bolting, pinning, keying, splining or other geometry feature(s). In this illustrated example, the angular orientation of flex bars utilizes center 4 and radial 8 timing features, and a shoulder bolt to fix orientations to the common center structure, FIG. 3. Since there is no critical stress in the Center cylindrical mount, this timing feature can be positioned to support the mounting requirements. The purposes of timing feature include: 1) timing of angular position for flex planes, 2) coaxially align contact surfaces, 3) provides assembly feature for pulling on flexbar to remove compression on rod, which allows the shims and plug to be removed and changed. Once the assembly process is reset with shims and the snap ring, the "pulling" bolt can be released, placing compression back on the Terfenol rod.

It is to be appreciated that in different embodiments of the present invention, the flex bars can be identical or a combination of primary, secondary, or $n^{th}$ flex bar designs, and that the flex bars can be varied in length, spring constant values (k), and material.

It is preferred that the flex bars be rigidly mounted at the center 4 and end 5 cylinders to maintain all planar orientations in all spatial positions. Thus, only linear motion occurs axially aligned with the magnetostrictive actuator.

The flex bars may be constructed of commonly used materials for springs such as 440C stainless steel, and may utilize heat and surface treatments to ensure infinite life. The design allows for scalability.

In embodiments of the present invention, the tree shaker head, the center, and the end cylindrical features are preferably axially aligned for manufacturability. However, if required for performance optimization, the end cylindrical features could be non-coaxial.

Flex bars mounting options:
1. Planar mounting (embodiment of FIG. 5)
   a. Flex bars should preferably be mounted normal to the Mid-Plane to a common structurally sufficient structure (Spline, 12).
   b. Flex bars should preferably be axially parallel.
   c. The flex bar end cylinders should preferably be rigidly mounted to a singular reaction masses by means of an axial and radial constraining pocket.
   d. In a planar mounting, only the primary flex bar spherical surface need be axially aligned with the actuator. The preload is achieved, for example, by using a compression plug with a convex spherical contact surface 15, shims 16, and a retaining ring 17. The retaining ring transfers the force and displacement to a heavy reaction mass, which is connected to the End Cylindrical mounts 5 of the primary 18 and secondary 18' flex bars. Preloading the magnetostrictive actuator using a preload plug:
      i. Requires no threaded parts
      ii. No potential for torque transmission.
   e. All effort should be made to minimize the use of threaded connectors. Due to the vibration of the system, threaded connectors are more likely to loosen.
   f. When setting up preload on the actuator, the angular orientation bolt may be removed and replaced with a bolt connected to a hydraulic puller bar. The puller bar pulls against the center cylinder while contacts apply an equal and opposite force on the rigid mass at the end cylinders. Shims may be added or subtracted from the preload plug to establish correct preload on the magnetostrictive rod.

Figure 6:
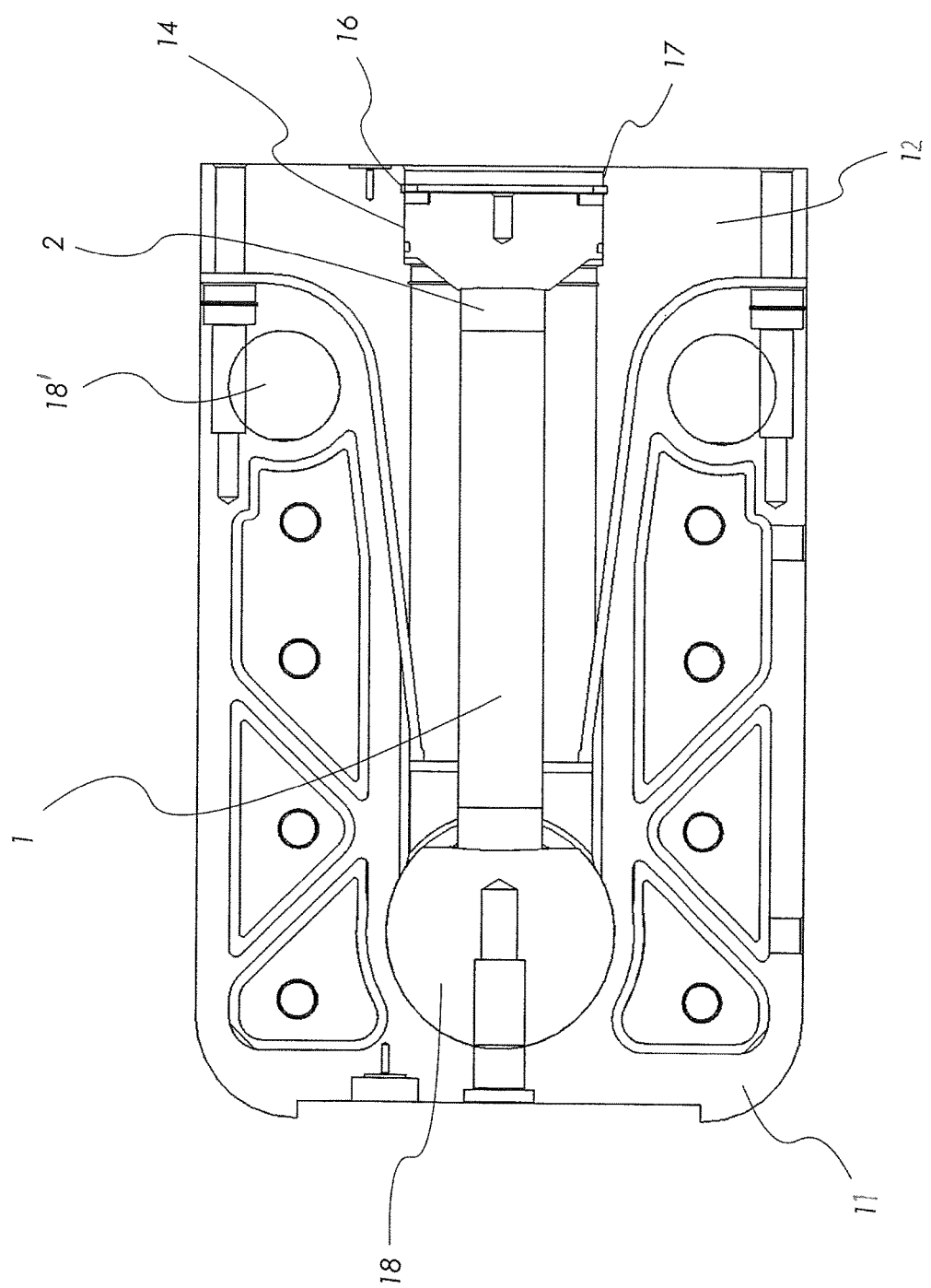
FIG. 6 illustrates a cross section of an embodiment of a planar shaker head utilizing a central Spline 11 to mount the flex bars 18 and 18'. In this embodiment, the centers of the flex bars are anchored to the first reaction mass or Spline 11, and the ends of the flex bars are anchored to the other Reaction mass 12. The magnetostrictive actuator 1 assembly with spherical endcaps 2 is compressed between the primary Flex bar 18 and the compression plug 14. Shims 16 are used to adjust the preload on the magnetostrictive actuator and secured with a retaining ring 17.

FIG. 6 shows an exemplary cross section of a planar shaker head of the present invention.

Figure 7:
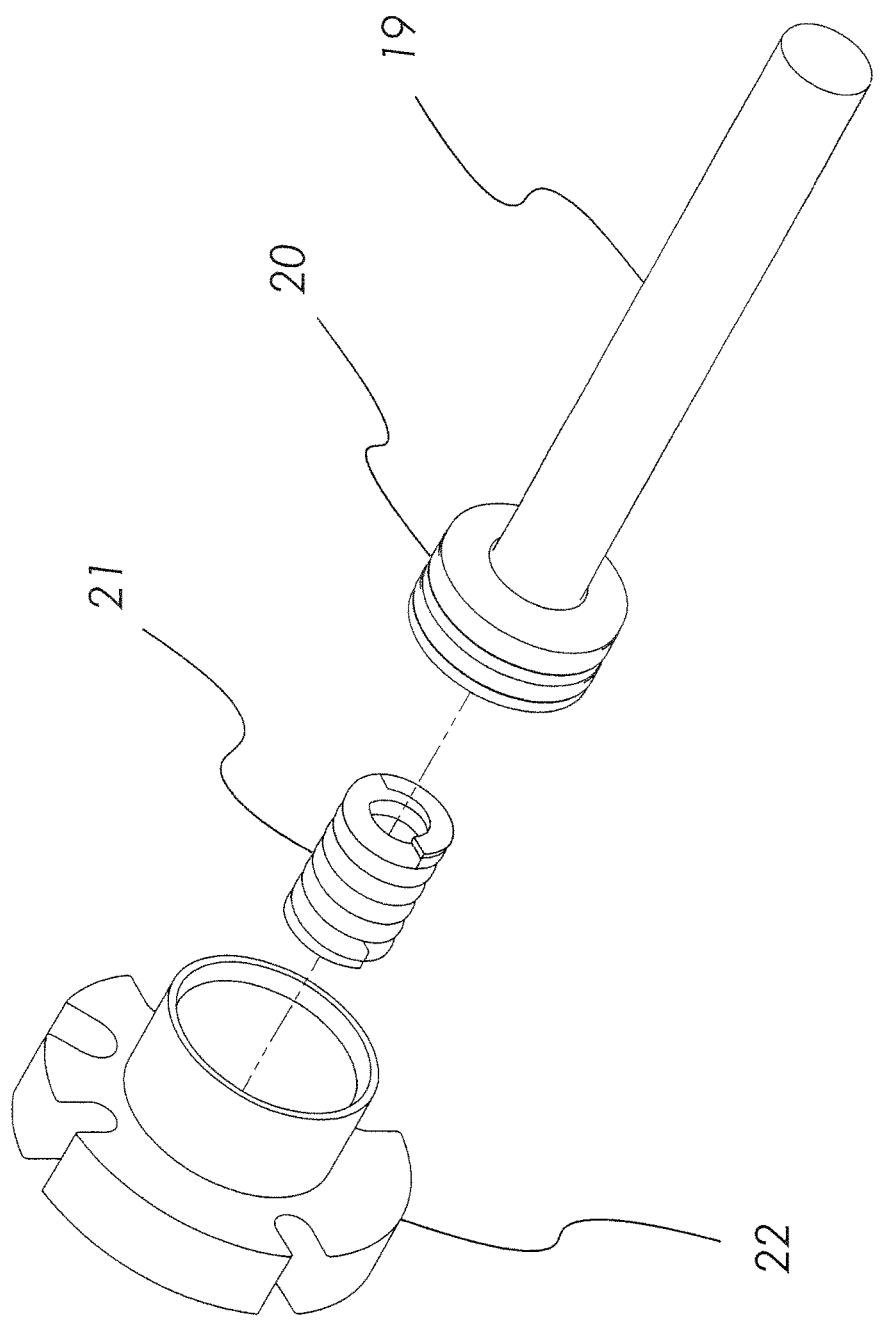
FIG. 7 illustrates an alternative embodiment using a hydraulic cylinder actuator module. The components of the cylinder include a rod and piston 19, preload spring 21, and a cylinder 22.
Figure 8:
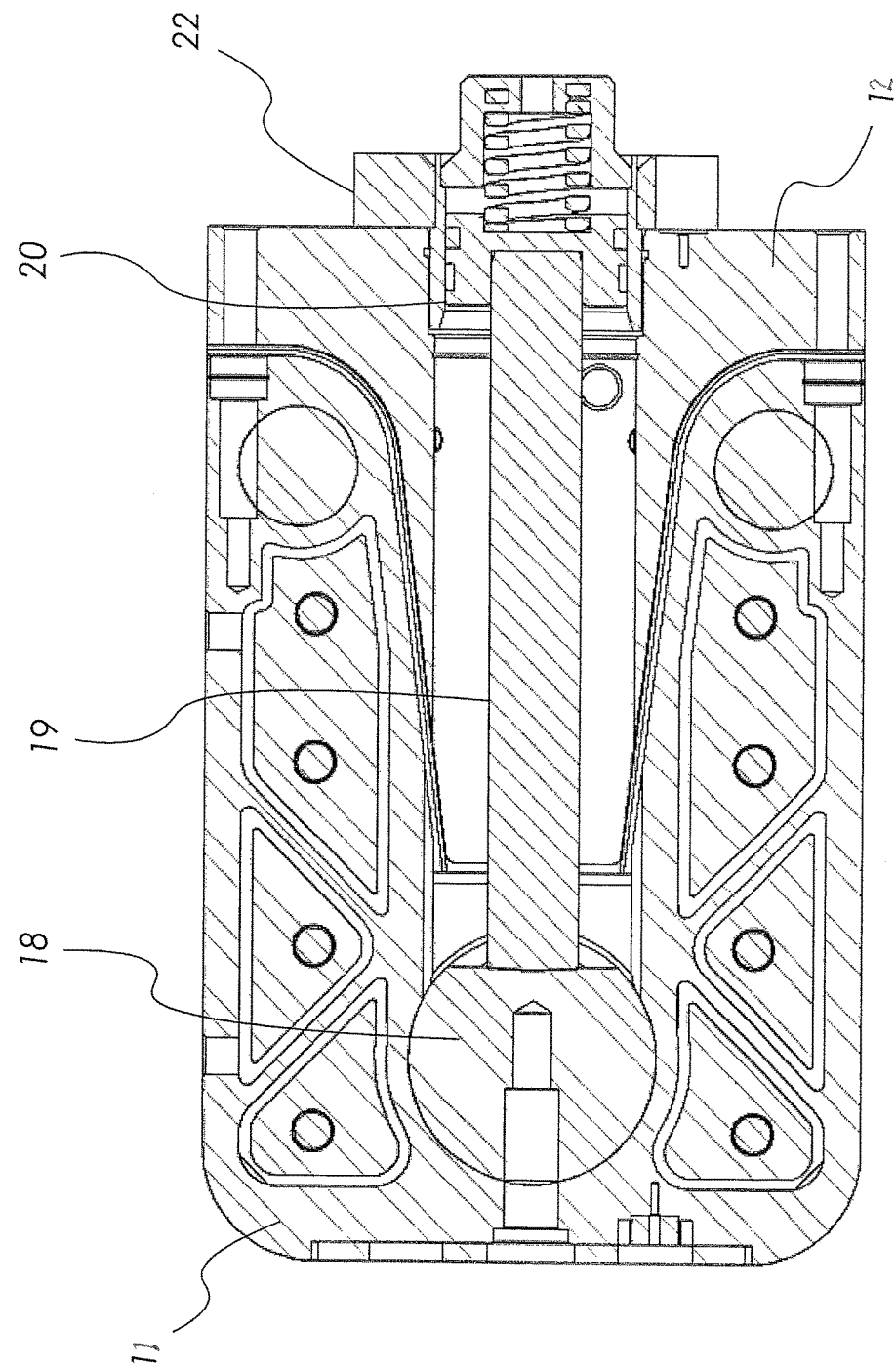
FIG. 8 illustrates a cross section of an alternative embodiment utilizing a hydraulic actuator mounted in a two-mass planar flex bar system.

In an alternative embodiment shown in FIGS. 7 and 8, a single acting hydraulic cylinder is provided instead of a magnetostrictive actuator to provide displacement and vibration for lower frequency systems. The piston and connecting rod 19 convert and transfer hydraulic pressure to the flex bar. The connecting rod has a spherical surface that locates in the corresponding spherical surface of the flex bar (concave/convex), providing all of the same advantages of the magnetostrictive actuator. The preload spring 21 maintains spherical contact surfaces engagement prior to energization of the hydraulic system. The hydraulic cylinder 22 is attached to the large mass structure 12 and forces displacement of the spline 11 by applying a force to the primary flex bar 18 mounted and orientated in the second mass. One of the purposes of the hydraulic actuator embodiments is to increase the stroke, and reduce the frequency. In order to accomplish this, bearings may be added to the ends of the flex bars, allowing the flex bars to "flex" further.

Figure 9:
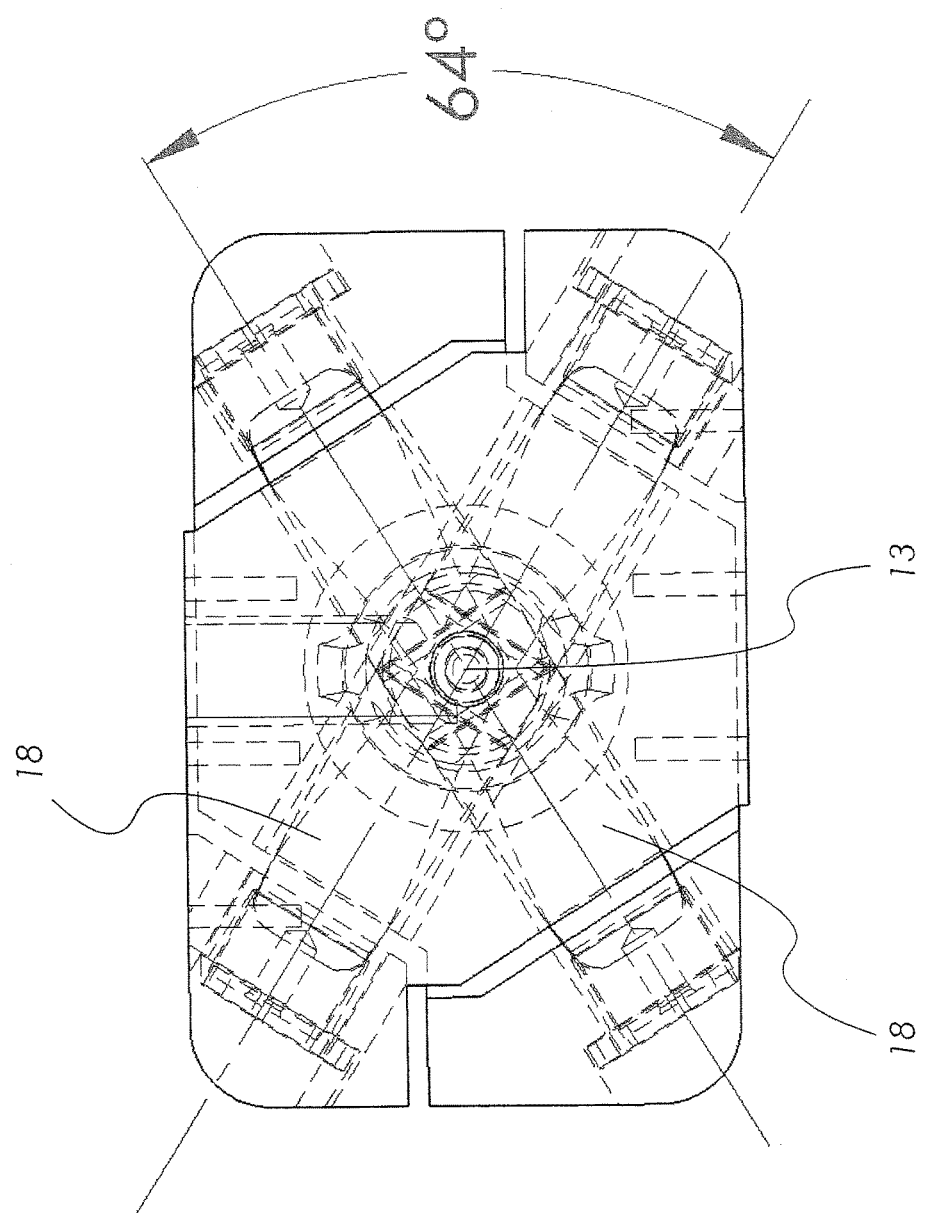
FIG. 9 illustrates an alternative embodiment having radial orientation of flex bars resulting in the elimination of compression plug snaps ring, and multiple flex bar part numbers.
Figure 10:
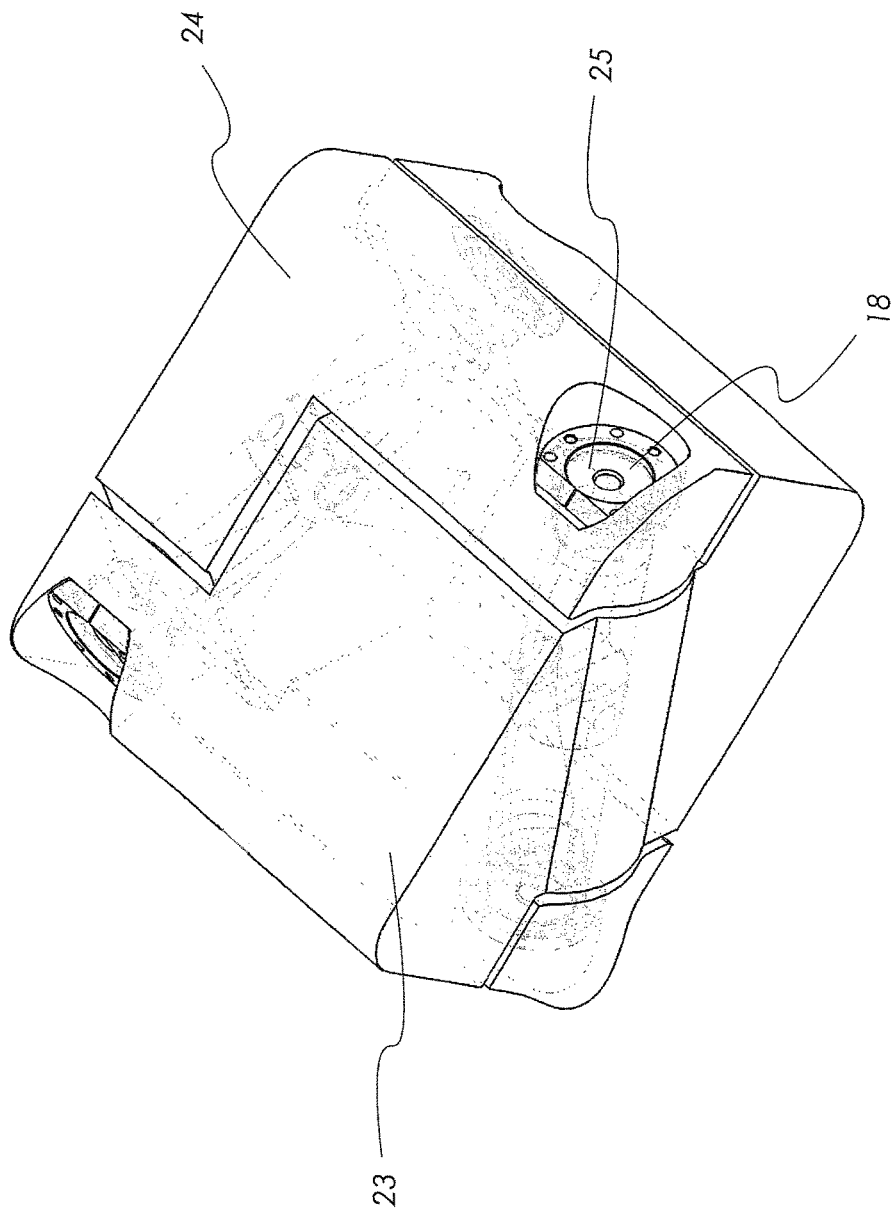
FIG. 10 illustrates an embodiment having flex bars mounted in a radial orientation about a common axis of the magnetostrictive actuator.
Figure 11:
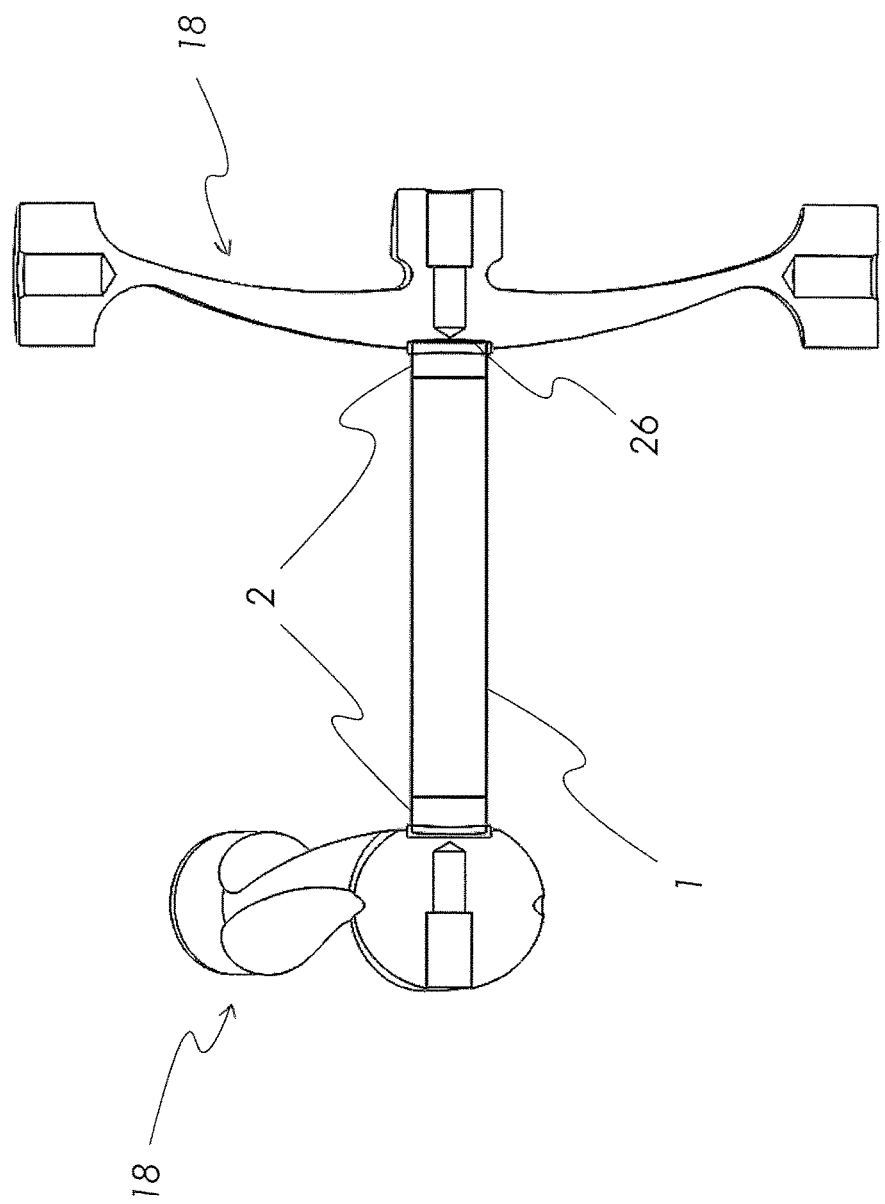
FIG. 11 illustrates a cross section of an exemplary embodiment of a radial flex bar shaker head. The magnetostrictive actuator 1 and spherical endcaps 2 are captured by the compressive force of two flex bars 18. The value of the compressive preload is determined by a compression-shim 16 with a spherical contact on one face.
Figure 12:
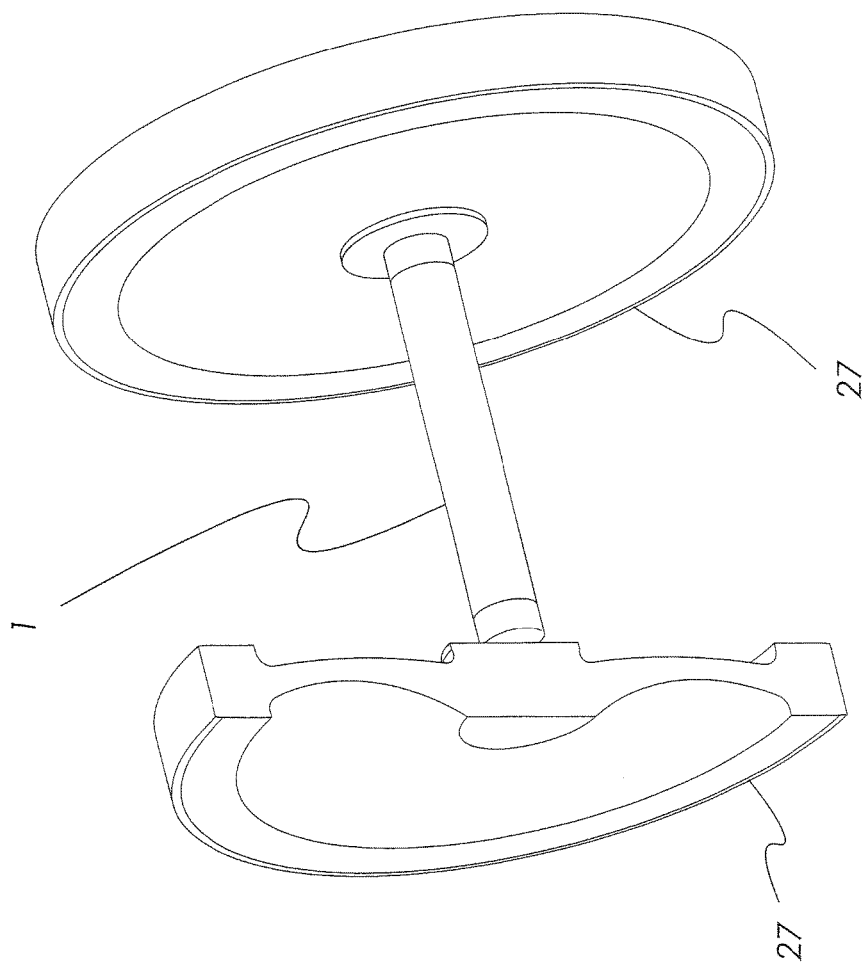
FIG. 12 illustrates an embodiment utilizing a disk design, where the magnetostrictive actuator could be spherically mounted, preloaded and connected to reaction masses.

2. Radial orientation (alternative embodiments of FIG. 9 and FIG. 10).
   a. Further simplifies the system and minimizes part count.
   b. The radial shaker head assembly preferably utilizes two flex bars. Both flex bars are orientated to align both spherical contact surfaces axially with the actuator centerline 13. The flex bars are mounted radially about the actuator centerline to constrain the degrees of freedom to one (for example and without limitation, in this illustrated system it is 64 degrees, FIG. 9). If the outer profile for the masses was cylindrical, the flex bars could be positioned, for example, 90 degrees apart.
   c. The flex bar end cylinders are mounted to non-common reaction masses. By example, the flex bar Center Cylindrical mount of one flex bar is constrained to mass A (23), and the End Cylindrical mount of this flex bar is rigidly constrained to mass B (24). The second and opposing flex bar, the Center Cylindrical mount is mounted to mass B, and the End Cylindrical mount is secured to mass A. The reaction masses, by example, may be attached to the flex bar End Cylindrical by means of a compressible tapered coupler. Additional mounting options include blind pocket, taper locked, soldering, welding, heat shrink, and/or other shaft mounting options. Another option would be to make a bearing cap, similar to a piston connecting rod. This option would require a more complex machining process and may not guarantee axial alignment with the center cylinder.
   d. Eliminates the need for a compression plug and snap ring.
   e. The magnetostrictive actuator acts directly upon the flex bars, constrained to a unique mass structure, to deflect the masses proportionally to mass ratio.
   f. The spherical contact surface on the flex bar is replaced with a shim pocket.
   g. A hardened compression-shim, with a spherical contact surface, may fit between the flex bar and magnetostrictive actuator assembly.
   h. The preload is adjusted by using an exact compression-shim thickness plate between the flex bar and the spherical endcaps. This allows for adjusting for the statistical variation between manufactured flex bars, hardened spherical endcaps, and Terfenol-D rod. This shim-able solution ensures repeatable final product performance.

Any number of alternative spring elements are contemplated within the scope of the invention that would connect to the mass elements (e.g., mass 12 and spline 11 of FIG. 8). As noted before, the flex bars could be manufactured from square or rectangular material or circular/disk, "flex disk" shape and meet all of the functional achievements the disclosed flex bars. The difference would be the reaction mass attachment method.

The flex bar (rectangular, square, or disk) design with a spherical contact surface for locating and preloading magnetostrictive actuators is equally applicable to electrostrictive actuators in alternative embodiments.

It is to be understood that the spherical contact mating surfaces could be convex or concave on either the flex bar or hardened endcaps.

All embodiments of the invention:
allow for passive rejection of foreign materials such as dirt and trash associated with crop harvesting to pass through the assembly gaps.
support the robustness required for spatial orientation of tree harvesting, other spatial applications, or fixed orientations.
result in dynamic displacements of up to 5000 ppm strain.

It should also be understood that the foregoing descriptions of specific embodiments of the present invention have been presented for purposes of illustration and description. They are not intended to be exhaustive or to limit the invention to the precise forms disclosed, and many modifications and variations are possible in light of the above teachings. The embodiments were chosen and described in order to best explain the principles of the invention and one practical application to tree shaker harvesting, to thereby enable others skilled in the art to best utilize the invention and various embodiments with various modifications as are suited to the particular use contemplated.

What is claimed is:

1. An apparatus for vibrating a large mass comprising:
   a. a first reaction mass comprising a spline;
   b. a primary flexible bar member provided in said spline, said primary bar member comprising an elongated flexible body with mounts provided at opposite ends thereof, and further comprising a central section having a central mount and a spherical contact area located thereon, wherein said end mounts are engaged with a second reaction mass and said central mount is engaged with said spline;
   c. a plurality of secondary flexible bar members provided in said spline, each secondary bar member comprising an elongated flexible body with second mounts provided at opposite ends thereof, each secondary bar member further comprising a central section having a second central mount located thereon, wherein said second end mounts are engaged with said second reaction mass, and said second central mounts are engaged with said spline;
   d. a compression plug provided in said frame anchored to said second reaction mass, said plug having a spherical outer surface thereon;
   e. an elongated magnetostrictive actuator rod having a first hardened endcap at one end thereof, and a second hardened endcap at an opposite end thereof, the outer surface of each such endcap having a complementary spherical surface located thereon, wherein said actuator rod is mounted between said primary flexible bar member and said compression plug such that the spherical area of said first endcap is in communication with the complementary spherical contact area on said primary bar member, and the spherical surface of said second endcap is in communication with the complementary spherical surface of said compression plug.

2. The apparatus of claim 1 further comprising at least one shim provided between said compression plug and said spline.

3. The apparatus of claim 1 wherein said primary and secondary flexible bar members have longitudinal flexibility planes that are axially parallel, and sectional flexibility planes that are offset.

4. The apparatus of claim 1 wherein said primary and secondary flexible bar members have longitudinal flexibility planes that are parallel, and sectional flexibility planes that are radially offset.

5. The apparatus of claim 1 wherein said actuator rod is compressed between said compression plug and said primary flex bar member to provide preloading of the actuator rod without the use of threaded fasteners.

6. The apparatus of claim 1 wherein said flexible bar members are provided in any spatial orientation without introduction of coupled moments, deflection, or non-coaxial motion relative to the centerline axis of the magnetostrictive actuator.

7. The apparatus of claim 1 wherein said flexible bar members constrain the relative movement between first of said mass to a single degree of freedom coaxial with the magnetostrictive actuator.

8. The apparatus of claim 1 wherein the spline is clamped to a trunk or limb of a tree.

9. The apparatus of claim 1 wherein the spline is connected to the second reaction mass using flexible bars.

10. The apparatus of claim 1 wherein the flexible bars allow the reaction masses to move coaxial with the actuator.

11. The apparatus of claim 1, wherein each flexible bar further comprises:
    a. a center cylindrical element on each flexible bar for the purpose of securing the flex bar to the first reaction mass (spline);
    b. an end cylindrical element on each flexible bar for securing the ends of the flexible bars to the second reaction mass;
    c. a flexible section with a sufficient spring constant to apply the preload;
    d. a flexible section with a sufficient spring constant to also prevent unloading the magnetostrictive actuator due to mass inertia;
    e. a flexible section with a significantly high section modulus to constrain the mass to linear motion during displacement and spatial orientation;
    f. a concave or convex spherical contact surface for axially aligning the magnetostrictive actuator;
    g. a concave or convex spherical contact surface the prevents the creation and transfer of coupled moments or torque; and
    h. an orientation feature to coaxially align the spherical contact surface with the magnetostrictive actuator centerline, and align the plane of the flex bar perpendicular to the magnetostrictive actuator centerline.

12. The apparatus of claim 1 wherein:
    a. the center cylindrical mounts of multiple flex bars are rigidly mounted to the first reaction mass (spline);
    b. the center cylindrical mounts are angularly timed, such that each flexible section plane is parallel to all flex bars rigidly mounted to the first reaction mass;

c. the end cylindrical mounts are rigidly mounted to the second reaction mass;
d. the planar mounting constrains the relative motion of the masses to coaxial to the actuator centerline in any spatial orientation;
e. the preload is provided by a compression plug and shim pack; and
f. all motion, strain and deformation, is constrained to the flexible section of each flexible bar.

13. The apparatus of claim 1, wherein each flexible bar further comprises:
a. a center cylindrical element for the purpose of securing the flexible bar to the first reaction mass (spline);
b. an end cylindrical element on each flexible bar for securing said bar to the second reaction mass;
c. a flexible section with a sufficient spring constant to apply the preload;
d. a flexible section with a sufficient spring constant to prevent unloading the magnetostrictive actuator due to mass inertia;
e. a flexible section with a significantly high section modulus to also constrain the mass to linear motion during displacement and spatial orientation;
f. a recessed cylindrical cavity, shim pocket, that allows mounting a shim with a concave or convex spherical contact surface for axially aligning the magnetostrictive actuator;
g. a recessed cylindrical cavity that allows mounting a shim with a concave or convex spherical contact surface establishing the required preload; and
h. an orientation feature to coaxially align the spherical contact surface with the magnetostrictive actuator centerline.

14. An apparatus for vibrating a large mass comprising:
a. a first reaction mass;
b. a second reaction mass interlocking with and opposing said first reaction mass but spaced apart therefrom;
c. a first flexible bar member comprising an elongated flexible body with mounts provided at opposite ends thereof, and a central section having a central mount and a spherical contact area located thereon, wherein the end mounts of said first flexible bar are engaged with said second reaction mass;
d. a second flexible bar member comprising an elongated flexible body with mounts provided at opposite ends thereof, and a central section having a central mount and a spherical contact area located thereon, wherein said end mounts of said second flexible bar are engaged with said first reaction mass;
e. an elongated magnetostrictive actuator rod having a first hardened endcap at one end thereof, and a second hardened endcap at an opposite end thereof, the outer surface of each such endcap having a complementary spherical surface located thereon, wherein said actuator rod is mounted between said first and second reaction masses such that the spherical area of said first endcap is in communication with the complementary spherical contact area on said first flexible bar member, and the spherical surface of said second endcap is in communication with the complementary spherical surface of said second flexible bar member.

15. The apparatus of claim 14 wherein the spherical surface actuator mounting surfaces of said end caps are co-axial and opposing.

16. The apparatus of claim 14 wherein the central mounts of the flexible bar members are cylindrical and secured to the first and second masses respectively.

17. The apparatus of claim 14 wherein the end cylindrical mounts of the first flexible bar member are rigidly mounted to the second mass.

18. The apparatus of claim 14 wherein the end cylindrical mounts of the second flexible bar member are rigidly mounted to the first mass.

19. The apparatus of claim 14 wherein a preload is established by placing a shim between the magnetostrictive actuator and a flexible bar shim pocket.

20. The apparatus of claim 14 wherein said first and second flexible bar members have longitudinal flexibility planes that are parallel, and sectional flexibility planes that are radially offset.

21. The apparatus of claim 14 wherein the center mount and end mounts are cylindrical.

22. The apparatus of claim 14 wherein the center and end mounts are a geometry defined as non-cylindrical in shape.

23. The apparatus of claim 14 wherein the center and end mounts are a combination of cylindrical and non-cylindrical geometries.

24. The apparatus of claim 14 wherein the flex bar is revolved about an axis and best described as a disk.

25. The apparatus of claim 14 wherein the alternate designs include a central and end mounting elements, and a flexible section.

26. The apparatus of claim 14 further comprising a spherical surface for locating and aligning of the magnetostrictive actuator.

27. The apparatus of claim 14 further comprising a shim pocket for establishing preload on the magnetostrictive actuator.

28. The apparatus of claim 14 further comprising:
a. a compression plug installed in the second, opposing, mass;
b. the compression plug has a mating spherical surface which engages the magnetostrictive actuator;
c. the compression plug is shimmed to provide desired magnetostrictive actuator preload;
d. the compression plug is retained and transmits force from the actuator to the mass; and
e. requires no threaded features of parts.

29. The apparatus of claim 14 further comprising:
a. a compression shim is installed between the actuator and one or both of the flexible bar members;
b. the compression shim has a mating spherical surface which engages an end cap of the magnetostrictive actuator;
c. the compressing shim seats in a shim pocket on one or both of the flexible bar members;
d. the compression shim provides desired magnetostrictive actuator preload; and requires no threaded features or parts for installation.

30. The apparatus according to claim 1 wherein:
a. two hardened steel endcaps are bonded to the magnetostrictive actuator;
b. the bonding surfaces are parallel, normal and coaxial with the centerline of the magnetostrictive actuator;
c. the outer surfaces of the endcaps are spherical;
d. the spherical surfaces prevent the transmission of coupled moments and torque;
e. the spherical surface radius is defined by the length of the magnetostrictive actuator plus the length of both endcaps after finish machining; and
f. the spherical contact surface is normal and coaxial with the centerline of the magnetostrictive actuator.

31. An apparatus for vibrating a large mass comprising:
a. a spline;

b. a primary flexible bar member provided in said spline, each first bar member comprising an elongated flexible body with mounts provided at opposite ends thereof, and further comprising a central section having a central mount located thereon, wherein said end mounts are engaged with a first reaction mass and said central mount is engaged with a second reaction mass;
c. a plurality of secondary flexible bar members provided in said spline, said second bar member comprising an elongated flexible body with mounts provided at opposite ends thereof, and further comprising a central section having a second central mount and a contact area located thereon, wherein said second end mounts are engaged with said spline, and said second central mount is engaged with said second reaction mass;
d. a single acting hydraulic cylinder with a spherical surface at one end engaged with the spherical surface of the primary flexible bar member, which is connected to the spline, with the other end of the hydraulic cylinder secured to the second reaction mass.

32. An apparatus for vibrating a large mass comprising:
a. a first reaction mass comprising a spline;
b. a primary flexible bar member provided in said spline, said primary bar member comprising an elongated flexible body with mounts provided at opposite ends thereof, and further comprising a central section having a central mount and a convex contact area located thereon, wherein said end mounts are engaged with a second reaction mass and said central mount is engaged with said spline;
c. a plurality of secondary flexible bar members provided in said spline, each secondary bar member comprising an elongated flexible body with second mounts provided at opposite ends thereof, each secondary bar member further comprising a central section having a second central mount located thereon, wherein said second end mounts are engaged with said second reaction mass, and said second central mounts are engaged with said spline;
d. a compression plug provided in said frame anchored to said second reaction mass, said plug having a convex outer surface thereon;
e. an elongated magnetostrictive actuator rod having a first hardened endcap at one end thereof, and a second hardened endcap at an opposite end thereof, the outer surface of each such endcap having a complementary concave surface located thereon, wherein said actuator rod is mounted between said primary flexible bar member and said compression plug such that the concave area of said first endcap is in communication with the complementary convex contact area on said primary bar member, and the concave surface of said second endcap is in communication with the complementary convex surface of said compression plug.

33. An apparatus for vibrating a large mass comprising:
a. a first reaction mass comprising a spline;
b. a primary flexible bar member provided in said spline, said primary bar member comprising an elongated flexible body with mounts provided at opposite ends thereof, and further comprising a central section having a central mount and a concave contact area located thereon, wherein said end mounts are engaged with a second reaction mass and said central mount is engaged with said spline;
c. a plurality of secondary flexible bar members provided in said spline, each secondary bar member comprising an elongated flexible body with second mounts provided at opposite ends thereof, each secondary bar member further comprising a central section having a second central mount located thereon, wherein said second end mounts are engaged with said second reaction mass, and said second central mounts are engaged with said spline;
d. a compression plug provided in said frame anchored to said second reaction mass, said plug having a concave outer surface thereon;
e. an elongated magnetostrictive actuator rod having a first hardened endcap at one end thereof, and a second hardened endcap at an opposite end thereof, the outer surface of each such endcap having a complementary convex surface located thereon, wherein said actuator rod is mounted between said primary flexible bar member and said compression plug such that the convex area of said first endcap is in communication with the complementary concave contact area on said primary bar member, and the convex surface of said second endcap is in communication with the complementary concave surface of said compression plug.

34. An apparatus for vibrating a large mass comprising:
a. a first reaction mass comprising a spline;
b. a primary flexible bar member provided in said spline, said primary bar member comprising an elongated flexible body with mounts provided at opposite ends thereof, and further comprising a central section having a central mount and a spherical contact area located thereon, wherein said end mounts are engaged with a second reaction mass and said central mount is engaged with said spline;
c. a plurality of secondary flexible bar members provided in said spline, each secondary bar member comprising an elongated flexible body with mounts provided at opposite ends thereof, each secondary bar member further comprising a central section having a central mount located thereon, wherein said end mounts are engaged with said second reaction mass, and said central mounts are engaged with said spline;
d. a hydraulic actuator rod having a first hardened endcap at one end thereof, and a piston at the opposite end thereof, the actuator rod being secured inside a hydraulic cylinder that is mounted to second said mass.

* * * * *